United States Patent [19]
Chandross et al.

[11] Patent Number: 5,879,857
[45] Date of Patent: Mar. 9, 1999

[54] ENERGY-SENSITIVE RESIST MATERIAL AND A PROCESS FOR DEVICE FABRICATION USING AN ENERGY-SENSITIVE RESIST MATERIAL

[75] Inventors: Edwin Arthur Chandross, Murray Hill; Francis Michael Houlihan, Millington; Omkaram Nalamasu, Basking Ridge; Elsa Reichmanis, Westfield, all of N.J.; Thomas Ingolf Wallow, Union City, Calif.

[73] Assignee: Lucent Technologies Inc., Murray Hill, N.J.

[21] Appl. No.: 813,732

[22] Filed: Mar. 7, 1997

Related U.S. Application Data

[63] Continuation-in-part of Ser. No. 803,703, Feb. 21, 1997.
[51] Int. Cl.$^6$ .............................. G03C 5/00; G03C 1/492
[52] U.S. Cl. ...................... 430/270.1; 430/296; 430/311; 430/326; 430/910
[58] Field of Search ................................ 430/270.1, 326, 430/325, 910, 311, 296

[56] References Cited

U.S. PATENT DOCUMENTS

| | | | |
|---|---|---|---|
| 4,666,820 | 5/1987 | Chandross et al. | 430/270 |
| 4,857,435 | 8/1989 | Hopf et al. | 430/192 |
| 5,310,619 | 5/1994 | Crivello et al. | 430/270 |
| 5,550,004 | 8/1996 | Honda | 430/270.1 |
| 5,565,304 | 10/1996 | Honda | 430/311 |
| 5,580,694 | 12/1996 | Allen et al. | 430/270.1 |

FOREIGN PATENT DOCUMENTS

| | | |
|---|---|---|
| 0 690 348 A | 1/1996 | European Pat. Off. . |
| 0 789 278 A | 8/1997 | European Pat. Off. . |
| 02 010344 | 1/1990 | Japan . |
| 06 123970 | 5/1994 | Japan . |

OTHER PUBLICATIONS

H. Ban J. Nakamura, K. Deguchi and A. Tanaka, "High–Speed Positive X–Ray Resist Suitable for Precise Replication of Sub–0.25–$\mu$m Features," *Journal of Vacuum Science & Technology B*, vol. 12, No. 6, Nov./Dec. 1994, pp. 3905–3908.

"Resolutioh and Etch Resistance of a Family of 193 nm Positive Resists", by Allen, R. D. et al., *Journal of Photopolymer Science and Technology*, vol. 8, No. 4, pp. 623–636 (1995).

"Microelectronics Technology, Polymers for Advanced Imaging and Packaging", by Reichmanis, E. et al., *American Chemical Society*, Washington, D.C. pp. 255–270 (1995).

*Primary Examiner*—John A. McPherson
*Assistant Examiner*—Rosemary Ashton
*Attorney, Agent, or Firm*—Richard J. Botos

[57] ABSTRACT

A process for device fabrication and resist materials that are used in the process are disclosed. The resist material contains a polymer in combination with a dissolution inhibitor and a photoacid generator (PAG). The dissolution inhibitor is the condensation reaction product of a saturated polycyclic hydrocarbon compound with at least one hydroxy (OH) substituent and a difunctional saturated linear, branched, or cyclic hydrocarbon compound wherein the functional groups are either carboxylic acid or carboxylic acid chloride groups. The condensation product has at least two polycylic moieties. The polymer optionally has acid labile groups pendant thereto which significantly decrease the solubility of the polymer in a solution of aqueous base. A film of the resist material is formed on a substrate and exposed to delineating radiation. The radiation induces a chemical change in the resist material rendering the exposed resist material substantially more soluble in aqueous base solution than the unexposed portion of the resist material. The image introduced into the resist material is developed using conventional techniques, and the resulting pattern is then transferred into the underlying substrate.

26 Claims, 1 Drawing Sheet

ENERGY-SENSITIVE RESIST MATERIAL AND A PROCESS FOR DEVICE FABRICATION USING AN ENERGY-SENSITIVE RESIST MATERIAL

CLAIM OF PRIORITY

This application is a continuation in part of U.S. Ser. No. 08/803,703 filed on Feb. 21, 1997, which is hereby incorporated by reference and which claims priority of Provisional Application Ser. No. 60/013,093 filed Mar. 8, 1996.

BACKGROUND OF THE INVENTION

1. Technical Field

The invention is directed to a process for device fabrication in which an energy sensitive resist material containing a dissolution inhibitor is used.

2. Art Background

Devices such as integrated circuits are complex structures made of a variety of materials. These materials are precisely configured to form the desired device by a variety of processes. A lithographic process is frequently used to transfer the desired configuration into a substrate to fabricate such devices.

Lithographic processes use intermediate materials frequently referred to as resists. A positive or negative image of the desired configuration is first introduced into the resist by exposing it to patterned radiation which induces a chemical change in the exposed portions of the resist. This chemical change is then exploited to develop a pattern in the resist, which is then transferred into the substrate underlying the resist.

The efficacy of a lithographic process depends at least in part on the resist used to transfer the pattern into the substrate. Certain types of resists offer particular advantages in the context of specific lithographic processes. For example, solution-developed resists are designed to have absorption characteristics appropriate for use at certain exposure wavelengths. It is axiomatic that, if the resist material is opaque to the exposing radiation, the exposing radiation will not be transmitted into the resist material and the desired chemical change will not occur. Therefore it is important to select a resist material that has the appropriate light transmission characteristics at the wavelength of the exposing radiation. Other considerations that drive the selection of an appropriate resist material include the etch resistance of the resist after it has been exposed and developed.

In this regard, resist materials that contain polymers with ethylenic and/or aromatic unsaturation are typically used in lithographic processes for device fabrication in which the wavelength of the exposing radiation is in the traditional ultraviolet (UV) or deep UV range (i.e., about 240 nm to about 370 nm). However, these resist materials are often not suitable in processes in which the exposing radiation is 193 nm because the carbon-carbon double bond absorbs radiation at this wavelength. Consequently, resist materials that are being used for lithographic processes in which the exposing radiation has a wavelength of 248 nm or more are generally not useful in processes that use exposing radiation with a wavelength of 193 nm. Since lithographic processes for fabricating devices using 0.18 µm and 0.13 µm design rules are likely to use 193 nm-wavelength light as the exposing radiation, resist polymers that do not contain significant amounts of ethylenic unsaturation are sought.

SUMMARY OF THE INVENTION

The present invention is directed to a lithographic process for device fabrication which utilizes an energy sensitive resist material that contains a polymer combined with a dissolution inhibitor and a photoacid generator (PAG). The dissolution inhibitor is the condensation reaction product of a saturated polycyclic hydrocarbon compound with at least one hydroxy (OH) substituent and a difunctional saturated linear, branched, or cyclic hydrocarbon compound wherein the functional groups are either carboxylic acid or carboxylic acid chloride groups. It is advantageous if the hydrocarbon moiety (excluding the functional groups) has at least two but less than about twelve carbon atoms. However, if the hydrocarbon moiety has more than about eight carbon atoms, it is advantageous if the polycyclic compound has two or more hydroxy substituents. The polycyclic compound also has a carboxylic acid substituent wherein the hydrogen is replaced with the acid labile moiety.

The acid labile moiety renders the compound less soluble than it otherwise would be if the hydrogen was not so replaced. The acid labile group provides the dissolution inhibitor with the desired degree of insolubility in aqueous base before the resist material in which it is incorporated is exposed to radiation. Upon irradiation and typically, a post-exposure bake, a sufficient portion of these acid labile groups are cleaved to render the resist material soluble in aqueous base. Examples of suitable acid labile substituents include t-butyl, t-amyl 1-methylcyclohexyl, 3-oxocyclohexyl, and bis(2-trimethylsilyl)ethyl, and other substituents that easily undergo cleavage of the acid labile group in the presence of the photoacid. A broad range of these acid labile substituents are well known to one skilled in the art. In the presence of acid, these groups produce a free carboxylic acid and an acidolysis or acid-catalyzed hydrolysis byproduct.

Examples of suitable polycyclic hydrocarbon compounds include cholate-based fused ring structures with one five-membered and three six-membered rings such as:

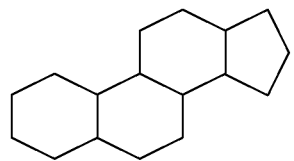

and adamantane. It is advantageous if the polycyclic hydrocarbon compound has at least two OH substituent groups. In the above identified structure, the OH substituents are typically on the six-membered rings. Cholate is an example of a polycyclic compound with three hydroxyl substituent groups on the polycyclic moiety (one OH substituent on each of the six-membered rings). Deoxycholate is an example of a polycyclic compound with two hydroxyl substituent groups on the polycyclic moiety (one OH substituent each on two of the six-membered rings).

It is advantageous if these polycyclic compounds are reacted with dicarboxylic acids or dicarboxylic acid halides of alkanes, alkoxy alkanes, cycloalkanes, and polycycloalkanes. The condensation reaction product contains less than about 50 but at least two polycyclic moieties. The number of polycyclic moieties per molecule will vary because of the way the condensation reaction proceeds. It is advantageous if the condensation product contains about 5 to about 20 polycyclic moieties on average.

In one embodiment of the present invention, the condensation reaction product is combined with a cholate-based monomer with the following structure:

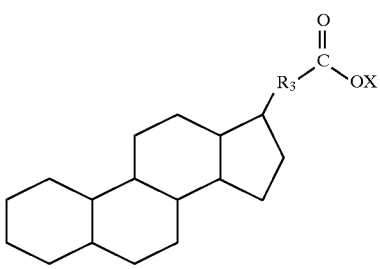

wherein X is an acid labile group as previously described and $R_3$, if present, is a lower alkylene moiety with six or fewer carbon atoms. In one embodiment, $R_3$ is butylene or isobutylene. The polycyclic moiety has at least one hydroxyl substituent group. In the above identified structure, the OH substituents are typically on the six-membered rings. Cholate is an example of a polycyclic compound with three hydroxyl substituent groups on the polycyclic moiety (one OH substituent on each of the six-membered rings). Deoxycholate is an example of a polycyclic compound with two hydroxyl substituent groups on the polycyclic moiety (one OH substituent each on two of the three six-membered rings).

In the embodiment of the present invention wherein the dissolution inhibitor is a combination of the above-described reaction product (referred to herein as the oligomeric compound) and the second compound (referred to herein as the monomeric compound) it is advantageous if the dissolution inhibitor is about 90 weight percent to about 10 weight percent of the oligomeric compound and about 10 weight percent to about 90 weight percent of the monomeric compound.

In the process of the present invention, the dissolution inhibitor combined with a polymer and, typically, an energy-sensitive compound such as a PAG is used as an energy-sensitive material. It is contemplated that other additives, such as amines that reduce the diffusion of acid from the exposed region to the unexposed region and that provide greater resistance to environmental contamination, will also be added to the composition. The combination of polymer and dissolution inhibitor is about 10 weight percent to about 50 weight percent dissolution inhibitor and about 90 weight percent to about 50 weight percent polymer. To this is added about 0.5 weight percent to about 20 weight percent PAG. The combination of polymer, dissolution inhibitor, PAG, and other additives (if present) are then combined with a spinning solvent such as polyglycol methylether acetate (PGMEA) and applied onto a substrate. Although the amount of solids (i.e. the polymer, dissolution inhibitor, PAG and other additives) relative to the amount of solvent is largely a matter of design choice, it is advantageous if the amount of solids is about 5 weight percent to about 30 weight percent and the amount of spinning solvent is about 70 weight percent to about 95 weight percent.

In the process, the energy-sensitive material is selectively exposed to radiation with a wavelength in the range of about 190 nm to about 300 nm to form an image of a desired pattern in the energy-sensitive material. That pattern is then developed and used in subsequent processing. Because the dissolution inhibitors described herein do not significantly absorb radiation at 193 nm, the dissolution inhibitors are particularly advantageous if used in lithographic processes in which the exposing radiation has a wavelength of about 193 nm.

Consequently, it is advantageous if the polymer selected for use in conjunction with the dissolution inhibitor is also compatible with lithographic processes for device fabrication in which the exposing radiation is about 190 nm to about 300 nm. Polymers contemplated for use in the process of the present invention include acrylate-based resins that are soluble in aqueous base solution (including resins in which the aqueous base solubility is "masked" by acid labile groups). Examples of such acrylate-based resins are described in Allen, R. D., et al., *Photopolymer Science and Technology*, Vol. 8, p. 623 (1995) which is incorporated by reference herein. Other examples of suitable polymers include the polymers with saturated alicyclic moieties described in U.S. Ser. No. 08/803,703 filed Feb. 21, 1997, wherein the saturated alicyclic moieties are incorporated either in the polymer backbone or attached to the polymer backbone via saturated hydrocarbon linkages.

In the embodiment of the present invention in which the polymer contains alicyclic moieties, it is advantageous if about 25 mole percent to about 50 mole percent of the polymer constitutes monomers that contain these alicyclic moieties. For convenience herein, the polymer is described in terms of the individual molecules (i.e., monomers) that are polymerized to form the polymer. The alicyclic moiety is advantageous because the polymers with alicyclic moieties therein have an advantageous resistance to plasma etching that is useful in processes for device fabrication. Examples of suitable polymers include terpolymers of norbornene, maleic anhydride and acrylic acid or methacrylic acid. Further examples include tetrapolymers of norbornene, maleic anhydride, acrylic acid, or methacrylic acid, and acrylate or methacrylate.

In one embodiment of the present invention, the resist polymer does not have acid labile groups pendant thereto and is inherently soluble in aqueous base. In a second embodiment, the resist polymer does have, to some fraction of its monomer units, acid labile groups pendant thereto and is inherently insoluble in aqueous base unless and until some significant amount of those acid labile groups are cleaved from the polymer and replaced by hydrogen atoms.

One example of an inherently soluble polymer is a copolymer of a cycloolefin such as substituted or unsubstituted norbornene, maleic anhydride, and at least one other monomer. If the cycloolefin is unsubstituted, then at least one of the other monomers should contain a free carboxylic acid. Acrylic acid and methacrylic acid are examples of suitable monomers. If the cycloolefin is substituted with an acidic functionality such as a carboxylic acid group, the other monomers are not required to contain a free carboxylic acid functionality.

In the embodiment wherein the polymer is inherently insoluble, the contrast between the unexposed and exposed portions of the resist material results from the aqueous base solubility of both the polymer and the dissolution inhibitor being altered by the acid generated by the PAG. The PAG generates the acid when the resist material is exposed to radiation and post-exposure baked.

In the process of the present invention, generally, the resist material containing the components described generally above is formed into a film on the surface of a substrate that is typically a silicon wafer. The silicon wafer will typically have layers of other materials formed thereon. These wafers, with or without layers of other materials formed thereon, are referred to herein as substrates.

The resist-coated substrate is then subjected to a pattern-wise exposure to radiation to delineate the image of a pattern into the energy-sensitive resist material. A chemical agent, the photoacid generated in the course of the irradiation, effects a chemical change (typically upon heating), which enhances the aqueous base solubility of the irradiated portion of the resist. The resist materials of the present invention are contemplated as useful in lithographic processes in which the exposing radiation is ultraviolet (UV) radiation with a wavelength of about 190 nm to about 300 nm.

After the image of the pattern is delineated in the resist material, the image is developed into a pattern by exploiting the difference in aqueous base solubility between the exposed resist material and the unexposed resist material. In the context of the present invention, the term "exposed resist material" implies the portion of the resist whose aqueous base solubility has been increased by exposure to the photoacid and, typically, heat.

After the development, the pattern in the resist is transferred into the underlying substrate using conventional etching expedients well known to one skilled in the art.

DETAILED DESCRIPTION

Figure 1:
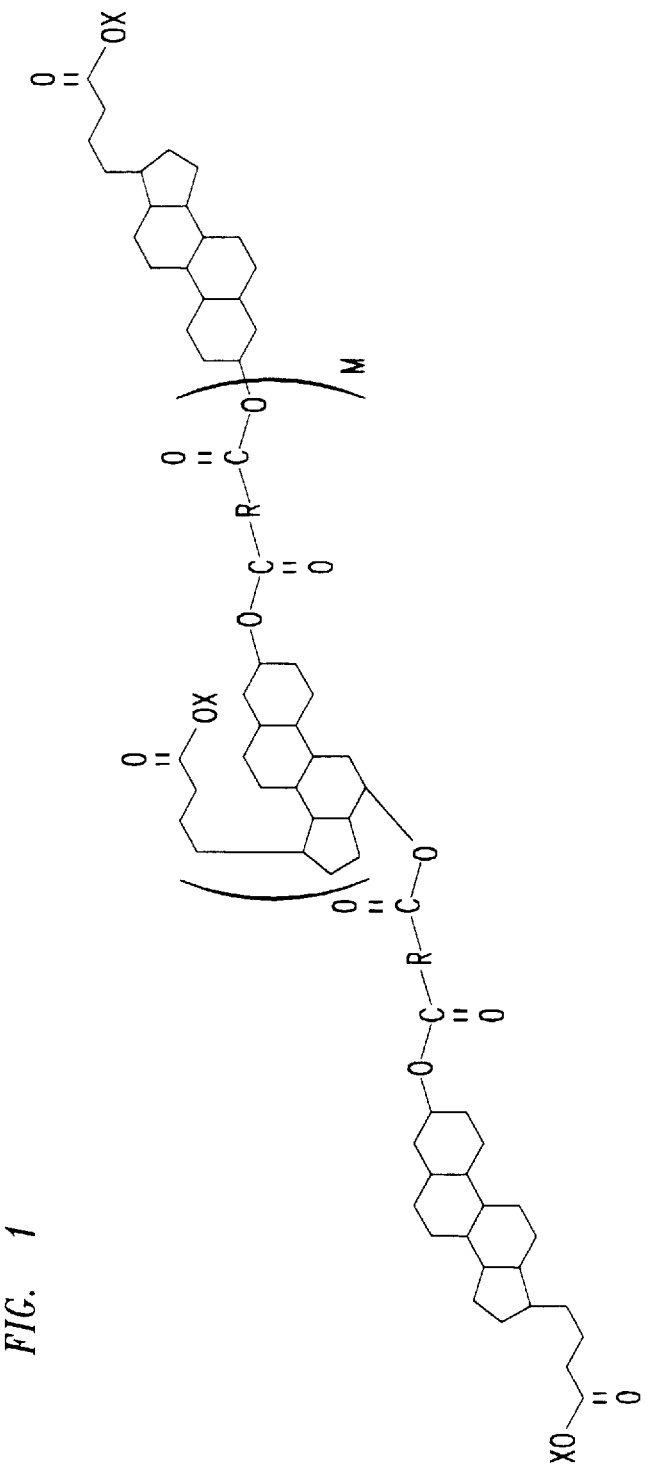
FIG. 1 illustrates the chemical structure of one class of dissolution inhibitors useful in the process of the present invention.

The present invention is directed to a class of energy-sensitive resist materials that are useful in lithographic processes for device fabrication. Processes for device fabrication which include lithographic steps have been described in treatises such as S.M. Sze, *VLSI Technology*, (McGraw-Hill pub., 1983) and L. F. Thompson et al., *Introduction to Microlithography*, pp. 87–161 (American Chemical Society Symposium Series 219, 1983) which are hereby incorporated by reference. Lithographic steps typically include exposing and patterning energy definable materials such as resist materials. An image is first introduced into the resist and developed to form a pattern, which is then transferred into the substrate.

The materials are energy-sensitive; i.e., energy induces a chemical change in these materials. When these materials are exposed to either patterned radiation of the appropriate wavelength, i.e., UV light with a wavelength of about 190 nm to about 370 nm, the chemical change is induced to a significantly greater extent in the portion of the resist material that is directly exposed to radiation than in the portion of the resist material that is not directly exposed to radiation. In the context of the present invention, significantly greater means that the chemical contrast induced by the patternwise exposure is adequate to meet processing objectives. This chemical difference is exploited to develop the pattern in the energy-sensitive resist material. The developed pattern is then used in subsequent processing, e.g., transfer of the developed pattern into an underlying substrate.

Aqueous base solutions are typically used to develop patterns in energy sensitive resist materials. One common example of an aqueous base solution is an aqueous solution of tetramethylammonium-hydroxide (TMAH) that is about 0.05M to about 0.5M, although many other solutions are well known to one skilled in the art.

In the positive-tone resist materials of the present invention, the material that is not exposed to radiation is relatively insoluble in the aqueous base developer solution relative to the material that is exposed to radiation. This difference in aqueous base solubility is effected primarily by manipulating the aqueous base solubility of a dissolution inhibitor in the energy-sensitive resist material.

As previously described, the dissolution inhibitor is a compound that is the condensation reaction product of a saturated polycyclic hydrocarbon compound with at least one hydroxy (OH) substituent and a difunctional, saturated, linear, branched, or cyclic hydrocarbon compound wherein the functional groups are either carboxylic acid or carboxylic acid halide groups. It is advantageous if the hydrocarbon moiety (excluding the functional groups) has at least two but less than about twelve carbon atoms.

Examples of difunctional carboxylic acids include linear alkane dioic acids such as oxalic acid, malonic acid, succinic acid, glutaric acid, adipic acid, heptanedioic acid, and octanedioic acid; branched alkane dioic acids such as diethyl malonic acid and 3-methyladipic acid; alkoxy alkane dioic acids such as diglycolic acid; cycloalkane dioic acids such as 1,6-dicarboxycyclohexane and 1,5-dicarboxycyclopentane. Examples of difunctional carboxylic acid halides include linear alkane dioyl chlorides and bromides (the bromides of the following examples are implicit in the disclosure of the chlorides) such as oxalyl chloride, malonyl chloride, succinyl chloride, glutaryl chloride, adipyl chloride, heptanedioyl chloride, and octanedioyl chloride; branched alkanedioyl chlorides and bromides such as diethyl malonyl chloride and 3-methyladipyl chloride; alkoxy alkanedioyl chlorides and bromides such as diglycolyl chloride; cycloalkanedioyl chlorides and bromides such as 1,6-dicarboxycyclohexane diacid chloride and 1,5-dicarboxycyclopentane diacid chloride.

The polycyclic compound also has a carboxylic acid substituent wherein the hydrogen is replaced with the acid labile moiety. As previously noted, in the process of the present invention, the above described dissolution inhibitor is used either alone or in combination with a second dissolution inhibitor that has a single fused ring polycyclic moiety.

In one embodiment of the present invention, the condensation reaction product has the structure illustrated in FIG. 1. As illustrated in FIG. 1, the cholate based oligomer has substituent groups pendant to the five-membered rings at both ends of the chain. These substituent groups are carboxylic acid groups wherein the hydrogen atom in the carboxyl moiety is replaced by an acid labile group X. M is from zero to about 50. In this embodiment, additional hydroxyl substituents on the six-membered rings are contemplated. Because of the nature of the condensation reaction, M will vary from molecule to molecule. It is contemplated that M, on average, is about 5 to about 20.

The dicarboxylic acid groups that link the polycyclic moieties together in FIG. 1 contain an R group which contains 12 or less carbon atoms. R is either a straight, branched, or cyclic alkylene or alkylene ether. It is advantageous if R is either an alkylene group or an alkylene ether group as previously described. If R has about eight to about 12 carbon atoms, it is advantageous if the polycyclic moiety has at least two OH substituent groups.

The fused ring polycyclic moieties depicted in FIG. 1 have at least one hydroxyl substituent on at least one of the six-membered rings. Since each hydroxyl substituent is a potential condensation reaction site, the oligomer formed from a polycyclic compound with more than one hydroxyl substituent will likely have a branched structure as opposed to the linear structure illustrated in FIG. 1. Further substitution of the polycyclic moieties is contemplated. If greater solubility in aqueous base is desired, the polycyclic moieties will have more than one hydroxyl substituent thereon. It is also contemplated that the polycyclic moieties will be further substituted with carboxylic acid substituents wherein the hydrogen atom in the carboxyl moiety is replaced by an acid labile group. In one embodiment the carboxylic acid substituent is present on the five-membered ring of the repeating structure M in FIG. 1. If such a carboxylic acid substituent contains a linear or branched chain alkylene group spacer, that spacer has about one to six carbon atoms.

If the dissolution inhibitor is a condensation reaction product of a cholate-based polycyclic compound and a difunctional carboxylic acid or difunctional carboxylic acid halide (the cholate-based oligomer), it is advantageous if the other material is a cholate monomer such as cholate or deoxycholate with the previously described carboxylic acid substituent on the five membered ring. It is advantageous if the aqueous base solubility of the carboxylic acid group is masked by an acid labile substituent as previously described. In the embodiment wherein the dissolution inhibitor is a combination of the cholate-based monomer and the cholate-based oligomer, it is advantageous if the dissolution inhibitor is about 90 weight percent to about 10 weight percent of the cholate-based oligomer and about 10 weight percent to about 90 weight percent of the cholate monomer.

In one embodiment, the resist material is formed by combining a polymer which is relatively soluble in an aqueous base solution, the dissolution inhibitor, and a PAG. In a second embodiment, the resist material is formed by combining a polymer which is relatively insoluble in aqueous base solution, with the dissolution inhibitor and a PAG. In all embodiments, the PAG generates photoacid when the resist is irradiated. The photoacid so generated, typically in conjunction with the application of heat (referred to as a post-exposure bake), promotes a chemical change that increases the aqueous base solubility of the irradiated resist. Resist materials containing the above-described dissolution inhibitors have properties such as good adhesion and good contrast which make them advantageous for use in processes for device fabrication.

In the process, the energy-sensitive material is selectively exposed to radiation with a wavelength in the range of about 190 nm to about 300 nm to form an image of a desired pattern in the energy-sensitive material. That pattern is then developed and used in subsequent processing. Because the dissolution inhibitors described herein do not significantly absorb radiation at 193 nm, the dissolution inhibitors are particularly advantageous if used in lithographic processes in which the exposing radiation has a wavelength of about 193 nm.

Consequently, it is advantageous if the polymer selected for use in conjunction with the dissolution inhibitor is also compatible with lithographic process for device fabrication in which the exposing radiation is about 190 nm to about 300 nm. Polymers contemplated for use in the process of the present invention include acrylate-based resins that are soluble in aqueous base solution. Examples of such acrylate-based resins are described in Allen, R. D., et al., *Photopolymer Science and Technology*, Vol. 8, p. 623 (1995), which is incorporated by reference herein. Other examples of suitable polymers include the polymers with saturated alicyclic moieties described in U.S. Ser. No. 08/803,703 filed Feb. 21, 1997.

In one exemplary embodiment, the polymer contains alicyclic moieties that are incorporated either in the polymer backbone or attached to the polymer backbone via saturated hydrocarbon linkages. The alicyclic moiety is advantageous because the polymers with alicyclic moieties therein have an advantageous resistance to plasma etching that is useful in processes for device fabrication. Examples of suitable polymers include terpolymers of norbornene, maleic anhydride and acrylate or methacrylate.

In this embodiment, the polymer is a copolymer of an alicyclic moiety-containing monomer (alicyclic monomer hereinafter) and at least two other monomers. The alicyclic moiety in the monomer is one or more hydrocarbon rings with one or more ethylenically unsaturated bonds. The ethylenic functionality of the monomer is either contained in the hydrocarbon ring or pendant to the hydrocarbon ring. The alicyclic monomer is either substituted or unsubstituted. Examples of suitable substituent groups include alkyl groups, carbonyl groups, carboxylate groups, hydroxyl groups and nitrile groups. These groups are offered by way of example only. Substituent groups that do not absorb radiation at the wavelength of the exposing radiation are contemplated as suitable. Examples of suitable alicyclic monomers are cycloolefins such as norbornene and 5,6-dihydrodicyclopentadiene and cyclodiolefins such as 1,5-cyclooctadiene and 1,5-dimethyl- 1,5-cyclooctadiene.

The second monomer is one that copolymerizes with the alicyclic monomer via a free radical polymerization. It is advantageous if the second monomer undergoes free-radical polymerization with the first monomer in a manner that incorporates the alicyclic moiety in the polymer backbone. Examples of suitable monomers include maleimide monomers, and maleic anhydride monomers. In the embodiment of the invention in which the exposing radiation has a wavelength of 193 nm, it is advantageous if the monomer is selected so that the resulting polymer contains a lithographically insignificant amount of ethylenic unsaturation or other functionality with an absorbance that is too high at the wavelength of the exposing radiation. In the context of the present invention, "lithographically insignificant" means that the amount is not sufficient to cause adverse lithographic consequences. Maleic anhydride is an example of a monomer that is suitable for copolymerization with the alicyclic moiety to provide a polymer that is useful in lithographic processes in which the exposure wavelength is 193 nm.

If it is desired for the polymer to be inherently soluble in aqueous base, the above-described monomers are polymerized with a third monomer such as an acrylic acid or a methacrylic acid. The third monomer or monomers are chosen to further enhance the performance of the resist materials in lithographic processes for device fabrication. In this regard, factors such as aqueous base solubility, substrate adhesion, thermal stability and the absorbance of the other monomers at the wavelength of the exposing radiation are considered in making the selection. Other factors such as the glass transition temperature of the resulting polymer are also considered in selecting additional monomers. One skilled in the art will appreciate the various factors in considering the monomers from which to form polymers which are suitable for use in the process of the present invention. Suitable additional monomer or monomers do not hinder the free radical polymerization of the first and second monomer. Specifically, the other monomer or monomers are selected so that the resulting polymer contains about five mole percent to about 50 mole percent of these other monomers. Preferably the resulting polymer contains about five mole percent to about 45 mole percent of these monomers.

One example of a suitable polymer that is inherently soluble in aqueous base is the polymerization product of a norbornene monomer, a maleic anhydride monomer, and an acrylic acid or methacrylic acid monomer. One example of the above-described polymer is represented by the following structure:

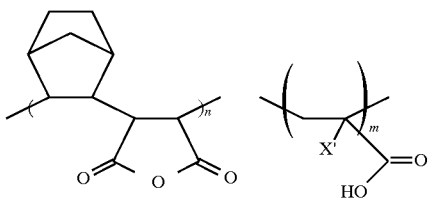

wherein n=about 0.95 to about 0.5, m=about 0.05 to about 0.5, and n+m=1. Embodiments wherein n=about 0.95 to about 0.75 and m=about 0.05 to about 0.25 are viewed to be advantageous. It is advantageous if n=0.85 to about 0.8 and m=about 0.15 to about 0.2. X' is either hydrogen or methyl.

It is also contemplated that the resist materials may be the polymerization product of more than three monomers. If more than three monomers are used, the fourth, fifth, etc. monomers are selected using the guidelines set forth above for the selection of additional monomers. In one example, the polymer is the polymerization product of four monomers: the monomer with the alicyclic moiety, maleic anhydride, the acrylic or methacrylic acid, and the substituted or unsubstituted acrylate or methacrylate. Although there are two additional monomers in the polymer of this embodiment, the polymer contains about five mole percent to about 50 mole percent of these additional monomers in total.

One example of a suitable inherently insoluble copolymer is the polymerization product of a norbornene monomer, a maleic anhydride monomer, and two acrylate monomers. The resulting polymer is represented by the following structure:

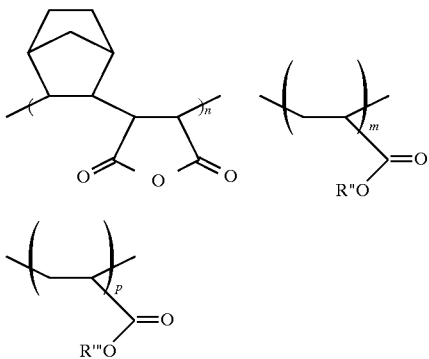

wherein n=about 0.95 to about 0.5, m+p=about 0.05 to about 0.5, and n+m+p=1. It is advantageous if n=0.85 to about 0.55 and m+p=about 0.15 to about 0.45. For the above polymer to be inherently insoluble in aqueous base, either R", R'" or both are substituent groups that provide the polymer with the desired insolubility. If one of either R" or R'" is a substituent that provides the polymer with the desired degree of insolubility, then the other of R" or R'" can be hydrogen. If R" is the substituent intended to render the polymer insoluble in aqueous base solution, then R" is an acid labile group. If R'" is the substituent intended to render the polymer insoluble in aqueous base solution, then R'" is an acid labile group. In the embodiment wherein one of R" and R'" is an acid labile group and the other of R" and R'" is hydrogen, the relative amount of m and p in the polymer is selected so that the polymer has the requisite degree of insolubility in aqueous base solution and has the requisite degree of differential solubility between the exposed resist material and the non-exposed resist material.

As noted above, the PAG generates an acid (the "photoacid" hereinafter) when the resist material is exposed to radiation. In this embodiment, the resist material is about 0.5 weight percent to about 20 weight percent (based on the weight of the polymer and dissolution inhibitor) PAG combined with the above-identified terpolymer. If the PAG content is above about 15 weight percent of the combined dissolution inhibitor/polymer, the optical density of the resist material may be too high and its presence above this concentration may hinder development.

In the embodiment wherein the resist material is used in a lithographic process in which the wavelength of the exposing radiation has a wavelength of about 193 nm, the amount of PAG depends upon the composition of the PAG. If the PAG contains an aromatic moiety, it is advantageous if the amount of PAG in the resist material is about 0.5 to about 4 weight percent, because the aromatic unsaturation in these moieties absorbs radiation at this wavelength. In other embodiments wherein radiation of a different wavelength is used, or where a PAG which does not absorb a lithographically significant amount of the exposing radiation is used, more PAG, about 1 weight percent to about 20 weight percent, is incorporated into the resist material.

The photoacid cleaves the acid labile groups from the dissolution inhibitor (and the polymer, if acid labile groups are present thereon), typically during a post-exposure bake. The cleavage of these groups from the polymer causes the exposed resist material to be more soluble than the unexposed resist material in aqueous base solution. An aqueous base developer solution is then used to dissolve and remove the exposed resist material. The unexposed resist material is then used as a patterned mask for subsequent processing of the underlying substrate; typically for pattern transfer into the substrate.

In the above-described embodiments, the solubility of the resist composition in aqueous base solution is altered when the resist material is exposed to radiation. Since the resist materials of the present invention are positive resists, the aqueous base solubility of the exposed resist is greater than the aqueous base solubility of the resist that is not exposed to radiation. If the ratio of the rate of dissolution of the resist before irradiation compared to that after irradiation is taken as 1:n, n should be not be less than 2. Relative solubility ratios with values of n less than 2 typically produce low contrast and inferior image quality.

An appropriate optical density in the wavelength range of the exposing radiation significantly enhances resist quality. Too low an optical density results in inefficient absorption of the exposing radiation and in unnecessarily long exposure times. Too high an optical density does not permit sufficient light to reach the regions of the polymer film furthest removed from its ambient/resist film interface. This incomplete exposure tends to degrade resist image quality. In general, it is desirable to employ an optical density that is preferably less than 0.6 for at least 30 percent of the exposing radiation to reach the substrate at the exposure wavelength.

The optical density depends on the concentration of the absorbing species in both the polymer and the PAG. Thus, once a suitable thickness for the resist material coating is chosen, the resist composition is adjusted to provide the desired optical density. For thicknesses as previously discussed in connection with film continuity, if the desired optical density is maintained, useful results are attained.

In the process of the present invention, generally, the resist material described generally above, is formed into a film on the surface of a substrate that is typically a silicon wafer. The silicon wafer will typically have layers of other materials formed thereon. These wafers, with or without layers of other materials formed thereon, are referred to herein as substrates.

The thickness of the film depends upon a variety of factors such as the absorption of the resist, the quality of the film, and the effect of thickness on image resolution. Typically, the thickness of the resist film is in the range of about 0.2 $\mu$m to about 2 $\mu$m.

After coating, the resist is preferably prebaked to remove any remaining solvent. Pre-exposure baking temperatures in the range of 70° C. to 160° C. for times in the range of about 0.5 to about 60 minutes are desirable. The resist material is then exposed to energy such as ultraviolet radiation with a wavelength of about 190 nm to about 300 nm. Typical doses in the range of 5 to 250 mJoules/cm$^2$ for 193 nm light are contemplated as suitable. Conventional exposure techniques are employed to delineate the resist material. One skilled in the art will appreciate that the selection of a suitable exposure dose will depend upon the particular resist material that is used, as well as other process variables.

It is then desirable to post exposure bake the exposed material. This post-bake enhances the reaction of, depending upon the particular embodiment, the relatively insoluble dissolution inhibitor and, if applicable, polymer, with the photoacid. Generally, post-bake temperatures in the range of about 70° C. to about 160° C. for time periods of about 20 seconds to about 30 minutes are effective. Heating means such as a hot plate sold by Brewer Sciences are contemplated as useful.

Solvents suitable for developing the exposed image are materials such as water/tetramethylammonium hydroxide, water/NaOH, or water and base with lower alkyl alcohols such as isopropanol, ethanol, methanol, and mixtures thereof. Generally, immersion in the developer for time periods from 20 seconds to 5 minutes produces the desired delineation.

After the development, the pattern in the resist is transferred into the underlying substrate using conventional etching expedients well known to one skilled in the art.

The following examples are provided to further illustrate exemplary embodiments of the present invention. The examples are not intended by way of limitation, except within the spirit and scope of the appended claims.

EXAMPLE 1

A terpolymer of norbornene, maleic anhydride and acrylic acid was synthesized according to the following procedure. Norbornene (40.34 g; 428 mmol) was vacuum-transferred into a dry 500 mL Schlenk flask equipped with two PTFE-stoppered inlet valves and an efficient stir-bar. Freshly sublimed maleic anhydride (34.63 g; 353 mmol), distilled acrylic acid (5.14 mL; 75 mmol), AIBN (0.703 g; 1 mole percent), and THF (100 mL) were added under positive argon pressure. The mixture was degassed by three freeze-pump-thaw cycles, sealed, and immersed in an oil bath at 65° C. for 24 hours. Upon cooling, the mixture was precipitated into 5 volumes of diethyl ether and filtered to collect the polymer. This process was repeated two more times. The polymer was collected in the final filtration and dried at 50° C. under vacuum.

EXAMPLE 2

A tetrapolymer of norbornene, maleic anhydride, t-butyl acrylate and acrylic acid was synthesized according to the following procedure. Norbornene (16.41 g; 174 mmol) was vacuum-transferred into a dry 500 mL Schlenk flask equipped with two PTFE-stoppered inlet valves and an efficient stir-bar. Freshly sublimed maleic anhydride (17.09 g; 174 mmol), distilled t-butyl acrylate (4.46 g; 34.8 mmol), and distilled acrylic acid (2.51 g; 34.8 mmol), AIBN (0.286 g; 1 mole percent), and THF (40 mL) were added under positive argon pressure. The mixture was degassed by three freeze-pump-thaw cycles, sealed, and immersed in an oil bath at 65° C. for 18 hours. Upon cooling, the mixture was precipitated into 5 volumes of diethyl ether and filtered to collect the polymer. Upon cooling, the mixture was precipitated into 5 volumes of diethyl ether and filtered to collect the polymer. This process was repeated three more times. The polymer was collected in the final filtration and dried at 50° C. under vacuum.

EXAMPLE 3

An oligomer of t-butyldeoxycholate and glutarate was synthesized by charging an oven-dried, argon-purged Schlenk tube with t-butyldeoxycholate (2 g; 4.457 mmol) (previously dried under vacuum at 60° C. overnight), N-methylmorpholine (1.1 mL; 10 mmol)(distilled from CaH$_2$), and methylene chloride (8 mL). The mixture was cooled to 0° C. and distilled glutaryl dichloride (0.552 mL; 4.324 mmol; 97 mole percent) was slowly added using a gas tight syringe. Precipitation of salt began as the addition was completed. The resulting slurry was stirred and allowed to warm to room temperature over the course of 30 minutes, then warmed to 40° C. for 30 minutes. The mixture was then poured into a separatory funnel containing methylene chloride (40 mL) and water (40 mL). The organic layer was washed four times with dilute aqueous ammonium acetate, and concentrated to yield a solid which was lyophilized from dioxane to yield a powder. The powder was dispersed in water (100 mL) and stirred for one hour. The powder was recollected by filtration and dried in vacuum. The yield was 1.5 g (64 percent). When this procedure was repeated using tetrahydrofuran (THF) the yield was 1.75 g (74 percent yield). The structure of the resulting oligomer was

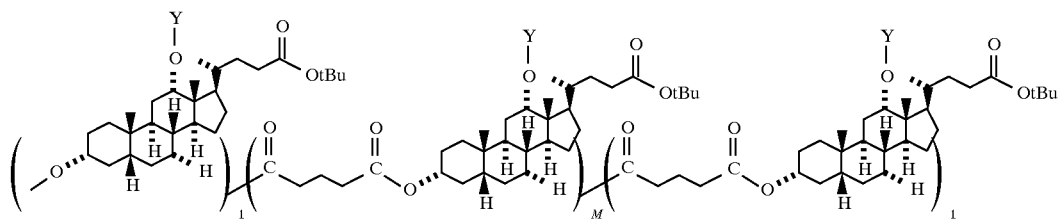

oligo(t-butyldeoxcholate-co-glutarate) end-capped with t-butyldeoxycholate wherein tBu indicates a tert-butyl substituent and Y indicates either a hydrogen or another unit in the structure defined by the parenthesis having subscript M or 1. The number of units M per molecule was about 5 to about 20. As previously noted, the condensation reaction can occur at any OH substituent on the polycyclic compound. Therefore, the above structure is provided to assist in describing the reaction product, but is not to be construed to depict the actual structure of the product that was obtained.

EXAMPLE 4

An oligomer of t-butylcholate and glutarate was synthesized by charging an oven-dried, argon-purged Schlenk tube with t-butyldeoxycholate (2 g; 4.457 mmol)(previously dried under vacuum at 60° C. overnight), N-methylmorpholine (3.26 g; 32.2 mmol)(distilled from CaH$_2$), and THF (35 mL). The mixture was cooled to 0° C. and distilled glutaryl dichloride (1.232 mL; 9.654 mmol; 1.632 g) was slowly added using a gas tight syringe. The tube was sealed and heated to 60° C. overnight. The reaction solution was then diluted with methanol (20 percent) and precipitated into water (500 mL) containing acetic acid to neutralize the N-methylmorpholine. The dilution/precipitation was repeated twice. The polymer was recollected by filtration, washed with distilled water and dried in vacuum at 60° C. The yield was 4 g (74 percent yield). The structure of the resulting oligomer was

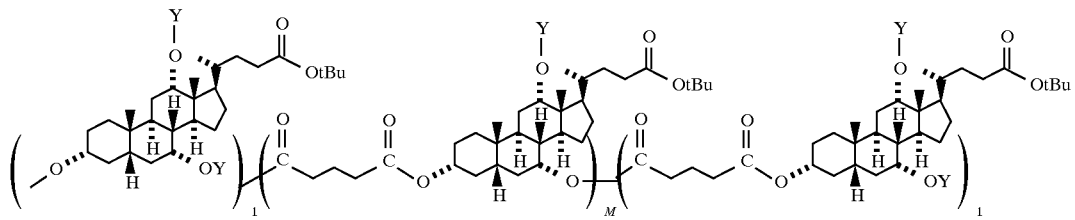

oligo(t-butylcholate-co-glutarate) end-capped with t-butylcholate wherein tBu indicates a tert-butyl substituent and Y indicates either a hydrogen or another unit in the structure defined by the parenthesis and having the subscript M or 1. The number of units M per molecule was about 5 to about 20. As previously noted, the condensation reaction can occur at any OH substituent on the polycyclic compound. Therefore, the condensation reaction product of a cholate (having three hydroxyl substituents) is likely to have a branched structure. The above structure is provided to assist in describing the reaction product, but is not to be construed to depict the actual structure of the product that was obtained.

EXAMPLE 5

Resist materials were prepared by combining either triphenylsulfonium triflate (TPST) or diphenyliodonium nonaflate (DPIN) (both are PAGs), a resist polymer, and a dissolution inhibitor with a spinning solvent. The resist material contained about 25 percent by weight solids (e.g. polymer, dissolution inhibitor, and PAG) in the spinning solvent. The amount of PAG in the formulations prepared was 1.5 weight percent of the solids (i.e., the PAG, polymer, and dissolution inhibitor). The amount of dissolution inhibitor was varied from zero to forty weight percent of the solids. The remaining portion of the solids was the resist polymer. Two polymers were used in this example. The first polymer was a terpolymer of norbornene, maleic anhydride and acrylic acid (NB-alt-MA-co-AA) in which about 17.5 mole percent of the repeat units were acrylic acid repeat units, the remaining portion of the polymer being roughly equal amounts of norbornene and maleic anhydride repeat units. The second polymer was a polymer of four monomeric units: norbornene, maleic anhydride, acrylic acid and t-butyl acrylate. In the second polymer about 17.5 mole percent of the units that made up the polymer were acrylic acid units, about forty mole percent of the units that made up the polymer were t-butyl acrylate units, and the remaining portion of the polymer being roughly equal amounts of norbornene and maleic anhydride repeat units(NB-alt-MA-co-TBA-co-AA). The polymers were prepared using the procedures described in the previous examples.

The polymers and PAGS were combined with varying amounts of the dissolution inhibitors described in the previous examples, either alone or in combination with a monomeric dissolution inhibitor (t-butyl deoxycholate). The amount of the total dissolution inhibitor in the resist material was 35 weight percent solids. A summary of the formulations, and the clearing dose and contrast factor of these formulations from 248 nm exposures, is summarized in the following table 1.

TABLE 1

| Polymer | Dissolution Inhibitor (wt %) | PAG (wt %) | Clearing Dose (mJ/cm$^2$) | Contrast Factor |
|---|---|---|---|---|
| NB-alt-MA-co-AA | Example 4 (35%) | DPIN (2%) | 30 | 4 |
| NB-alt-MA-co-AA | Example 4 (17.5%) and t-butyl deoxycholate (17.5%) | DPIN (2%) | 30 | 5 |
| NB-alt-MA-co-TBA-co-AA | Example 3 (25%) | TPST (1.5%) | 10 | >10 |
| NB-alt-MA-co-TBA-co-AA | Example 4 (17.5%) and t-butyl deoxycholate (17.5%) | DPIN (2%) | 27 | 8 |

The terpolymer was combined with cyclohexanone spinning solvent and the tetrapolymer was combined with PGMEA spinning solvent. The solutions were about 25 weight percent solids. The resists were passed through PTFE filter membranes (0.2 or 0.45 mm) prior to casting. Films were formed on HMDS-primed silicon wafers by spin-coating the wafers at a speed of 2000 rpm for 60 seconds at a temperature of 120° C. The films were exposed to radiation with a wavelength of 193 nm and a dose that ranged from one to 50 mJ/cm². The exposure tool used was an ISI 0.6 NA (numerical aperture) small field catadioptric exposure system exposure. The tool was used with optics that reduced the image by a factor of ten, and the tool had a partial coherence of 0.8. The films were baked at 150° C. for 160 seconds.

EXAMPLE 6

Resist formulations were prepared by combining NB-alt-MA-co-TBA-co-AA, a dissolution inhibitor which was a combination of equal parts by weight of t-butyl deoxycholate and the oligomeric dissolution inhibitor of Example 4. The PAG component in these formulations was bis(tert-butylphenyl)iodonium nonafluorobutanesulfonate. The polymer was 32.5 mole percent of the alternating norbornene and maleic anhydride unit, 45 mole percent of the tert-butyl acrylate and 22.5 mole percent of the acrylic acid.

Two resist formulations were prepared, one of which contained 63 weight percent polymer, 35 weight percent dissolution inhibitor and 2 weight percent PAG (all weight percents are weight percent solids (i.e., dissolution inhibitor, polymer and PAG)). The second formulation contained 62.7 weight percent polymer, 34.9 weight percent dissolution inhibitor, 2 weight percent PAG, and 0.4 weight percent of an amine additive, bis(4-tert-butylphenyl)iodonium cyclamate (weight percent solids).

The amine additive was prepared by dissolving bis(4-tert-butylphenyl)iodonium chloride (2.144 g; 5 mmol), which was synthesized as described in Crivello, J. V., *J. Polym. Sci.*, Vol. 56, p. 383 (1976), which is hereby incorporated by reference, in methylene chloride (100 mL) and then washing the mixture in a separatory funnel with a solution of sodium cyclamate (1.5; 1 mmol) dissolved in water (30 mL). After extraction, the methylene chloride layer was washed three times with water (30 mL). The methylene chloride was removed and the residue was recrystallized with a mixture of ethyl acetate and ether.

The resist formulations were combined with a spinning solvent (PGMEA). The resulting solutions were 13.7 weight percent solids in the solvent.

The solutions were used to form films on silicon wafers. The wafers were spin-coated with the solutions at a speed of about 3000–3900 rpm. The coated wafers were baked at 150° for about one minute. The nominal film thickness was about 0.36 μm to about 0.4 μm. A Nanospec AFT thickness gauge (refractive index set at 1.5) was used to measure the film thickness. Two films were formed using each formulation.

The resist films were exposed to radiation using an XLS 248 nm lithography tool. The tool had a KrF excimer laser radiation source and a 0.53 NA lens. A pattern of alternating lines and spaces with a nominal width of 0.27 μm was introduced into the films.

After exposure, the films were baked at 150° C. for one minute. One film of each formulation was developed immediately after exposure (zero delay) and one film of each formulation was developed 4 hours after exposure (4 hour delay).

The wafers were developed using a ten second puddle develop using tetramethyl ammonium hydroxide (0.262N; OPD-4262). The linewidths of the developed features were measured using an Hitachi S-600 CD-SEM and cross-section profiles were obtained using a JOEL 6400 F SEM. The films with the amine additive had features that exhibited considerably less line-slimming than the films without the amine additive. These results are summarized in the following table.

TABLE 2

| Resist Formulation | Feature Size (μm) w/o Time Delay (resolution dose) | Feature Size (μm) w/ 4 hr delay (resolution dose) |
|---|---|---|
| w/ amine additive | 0.263 (52 mJ/cm²) | 0.266 (52 mJ/cm²) |
| w/o amine additive | 0.17 (50 mJ/cm²) | not resolved |

The mask used to pattern the radiation was coded for 0.25 μm equal line-space features. As shown in the table 2, the size of the features developed in the resist with the amine additive were within acceptable limits. The size of the features developed in the resist without the amine additive exhibited excessive line slimming. After a four hour delay (i.e., a delay between exposure and development) the size of the features developed in the resist with the amine additive were within acceptable limits. However, after the same four hour delay, the features in the resist without the resist additive were not resolved.

What is claimed is:

1. A process for device fabrication comprising:

forming a layer of an energy sensitive resist material on a substrate wherein the energy sensitive resist material comprises a photoacid generator, a polymer, and a dissolution inhibitor wherein the dissolution inhibitor comprises a condensation reaction product of a saturated polycyclic hydrocarbon compound with at least one hydroxy (OH) substituent and a difunctional hydrocarbon compound selected from the group consisting of linear hydrocarbons, branched hydrocarbons and cyclic hydrocarbons, wherein the functional groups are either carboxylic acid or carboxylic acid halide groups wherein the condensation reaction product has at least two polycyclic moieties and at least one substituent group that is a carboxylic acid group in which the hydrogen atom in the carboxyl moiety is replaced by an acid labile group;

exposing the layer of energy sensitive resist material to patterned radiation selected from the group consisting of ultraviolet radiation, x-ray radiation, and electron beam radiation thereby introducing an image of the pattern into the resist material;

developing the image into a pattern; and transferring the pattern into the underlying substrate.

2. The process of claim 1 wherein the polycyclic moiety is a fused-ring polycyclic moiety.

3. The process of claim 2 wherein the difunctional hydrocarbon compound has at least one but no more than about twelve carbon atoms excluding the carbon atoms in the functional groups.

4. The process of claim 3 wherein the acid labile groups are selected from the group consisting of t-butyl, t-amyl, 1-methylcyclohexyl, 3-oxocyclohexyl, and bis(2-trimethylsilyl)ethyl.

5. The process of claim 4 wherein the fused ring polycyclic moiety is selected from the group consisting of adamantane and a moiety consisting of three six-membered rings and one five-membered ring with the following structure:

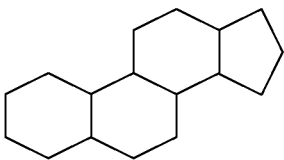

wherein there is at least one OH substituent group on at least one of the six-membered rings of the polycyclic compound and the condensation reaction product contains no more than about 50 of the polycyclic moieties.

6. The process of claim 5 wherein the polycyclic compound has at least two OH substituent groups on the polycyclic moiety.

7. The process of claim 6 wherein the difunctional hydrocarbon compound is selected from the group consisting of dicarboxylic acids and dicarboxylic acid halides of alkanes, alkoxy alkanes, cycloalkanes, and polycycloalkanes.

8. The process of claim 7 wherein the condensation product contains about 5 to about 20 polycyclic moieties.

9. The process of claim 8 wherein the polycyclic moieties have three six membered rings and one five membered ring and the dissolution inhibitor further comprises a cholate-based monomer with the following structure:

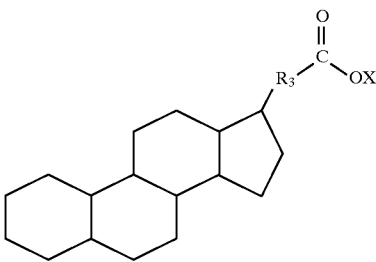

wherein X is an acid labile group, $R_3$ is either present or not and, if present, $R_3$ is a lower alkylene moiety with six or fewer carbon atoms and wherein there are at least two OH substituents on the polycyclic moiety.

10. The process of claim 9 wherein the dissolution inhibitor is about 10 weight percent to about 90 weight percent of the condensation reaction product of a saturated polycyclic hydrocarbon compound with at least one hydroxy (OH) substituent and a difunctional hydrocarbon compound and about 90 weight percent to about 10 weight percent of the cholate-based monomer.

11. The process of claim 1 wherein the polymer is selected from the group consisting of acrylate-based polymers which are soluble in aqueous base, methacrylate-based polymers which are soluble in aqueous base and polymers with alicyclic moieties incorporated into the polymer backbone, and polymers with alicyclic substituents pendant to the polymer chain.

12. The process of claim 11 wherein the exposing radiation is ultraviolet radiation with a wavelength of about 190 nm to about 300 nm.

13. The process of claim 12 wherein the exposing radiation is ultraviolet radiation with a wavelength of about 193 nm.

14. The process of claim 13 wherein the polymer is selected from the group consisting of terpolymers of norbornene, maleic anhydride, and acrylic acid, or methacrylic acid and tetrapolymers of norbornene, maleic anhydride, acrylic acid or methacrylic acid and acrylate or methacrylate.

15. A resist material comprising a photoacid generator, a polymer, and a dissolution inhibitor wherein the dissolution inhibitor comprises a condensation reaction product of a saturated polycyclic hydrocarbon compound with at least one hydroxy (OH) substituent and a difunctional hydrocarbon compound selected from the group consisting of linear hydrocarbons, branched hydrocarbons and cyclic hydrocarbons, wherein the functional groups are either carboxylic acid or carboxylic acid halide groups wherein the condensation reaction product has at least two polycyclic moieties and at least one substituent group that is a carboxylic acid group in which the hydrogen atom in the carboxyl moiety is replaced by an acid labile group.

16. The resist material of claim 15 wherein the polycyclic moiety is a fused-ring polycyclic moiety.

17. The resist material claim 16 wherein the hydrocarbon compound has at least one but no more than about twelve carbon atoms excluding the carbon atoms in the functional groups.

18. The resist material of claim 17 wherein the acid labile groups are selected from the group consisting of t-butyl, t-amyl, 1-methylcyclohexyl, 3-oxocyclohexyl, and bis(2-trimethylsilyl)ethyl.

19. The resist material of claim 18 wherein the fused ring polycyclic moiety is selected from the group consisting of adamantane and a moiety consisting of three six-membered rings and one five-membered ring with the following structure:

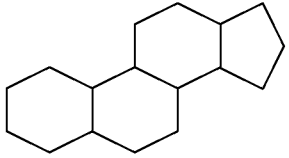

wherein the there is at least one OH substituent group on at least one of the six-membered rings of the polycyclic compound and the condensation reaction product contains no more than about 50 of the polycyclic moieties.

20. The resist material of claim 19 wherein the polycyclic compound has at least two OH substituent groups on the polycyclic moiety.

21. The resist material of claim 20 wherein the difunctional hydrocarbon compound is selected from the group consisting of dicarboxylic acids or dicarboxylic acid halides of alkanes, alkoxy alkanes, cycloalkanes, and polycycloalkanes.

22. The resist material of claim 21 wherein the condensation product contains about 5 to about 20 polycyclic moieties.

23. The resist material of claim 22 wherein the polycyclic moieties have three six membered rings and one five membered ring and the dissolution inhibitor further comprises a cholate-based monomer with the following structure:

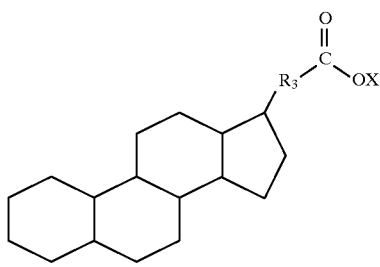

wherein X is an acid labile group, $R_3$ is either present or not and, if present, $R_3$ is a lower alkylene moiety with six or fewer carbon atoms and wherein there are at least two OH substituents on the polycyclic moiety.

24. The resist material of claim 23 wherein the dissolution inhibitor is about 10 weight percent to about 90 weight percent of the condensation reaction product of a saturated polycyclic hydrocarbon compound with at least one hydroxy (OH) substituent and a difunctional hydrocarbon compound and about 90 weight percent to about 10 weight percent of the cholate-based monomer.

25. The resist material of claim 15 wherein the polymer is selected from the group consisting of acrylate-based polymers which are soluble in aqueous base, methacrylate-based polymers which are soluble in aqueous base and polymers with alicyclic moieties incorporated into the polymer backbone, and polymers with alicyclic substituents pendant to the polymer chain.

26. The resist material of claim 25 wherein the polymer is selected from the group consisting of terpolymers of norbornene, maleic anhydride, and acrylic acid, or methacrylic acid and tetrapolymers of norbornene, maleic anhydride, acrylic acid or methacrylic acid and acrylate or methacrylate.

* * * * *